United States Patent [19]

Murakami

[11] Patent Number: 5,119,150
[45] Date of Patent: Jun. 2, 1992

[54] COMPOUND SEMICONDUCTOR STRUCTURE INCLUDING LAYER LIMITING SILICON DIFFUSION

[75] Inventor: Takashi Murakami, Itami, Japan
[73] Assignee: Mitsubishi Denki Kabushiki Kaisha, Japan
[21] Appl. No.: 664,301
[22] Filed: Mar. 4, 1991

Related U.S. Application Data

[62] Division of Ser. No. 264,142, Oct. 28, 1988, Pat. No. 5,047,366.

[30] Foreign Application Priority Data

Nov. 4, 1987 [JP] Japan .................. 62-278530

[51] Int. Cl.$^5$ .................. H01L 33/00; H01L 29/161
[52] U.S. Cl. .................. 357/17; 357/16; 357/63
[58] Field of Search .................. 357/4, 17, 16, 63

[56] References Cited

U.S. PATENT DOCUMENTS

| | | | |
|---|---|---|---|
| 4,680,768 | 7/1987 | Yagi | 372/45 |
| 4,727,556 | 2/1988 | Burnham et al. | 372/45 |
| 4,731,789 | 3/1988 | Thornton | 372/45 |
| 4,830,983 | 5/1989 | Thornton | 437/987 |
| 4,847,217 | 7/1989 | Omura et al. | 437/160 |

FOREIGN PATENT DOCUMENTS 0225772 6/1987 European Pat. Off.
34-6586 1/1959 Japan .
58-197786 11/1983 Japan .
59-123288 7/1984 Japan .

OTHER PUBLICATIONS

Omura, Wu et al., "Silicon Diffusion . . . Silicon Film", Applied Physics Letters, vol. 50, No. 5, 1987, pp. 265-266.
Omura, Vawter et al., "Selective Double Diffusion . . . Masks", . . . on Solid State Devices and Materials, Tokyo, 1986, pp. 41-44.
Greiner et al., "Diffusion of Silicon . . . Model", Applied Physics Letters, vol. 44, No. 8, 1984, pp. 750-752.

Primary Examiner—Andrew J. James
Assistant Examiner—Daniel N. Russell
Attorney, Agent, or Firm—Leydig, Voit & Mayer

[57] ABSTRACT

A semiconductor structure includes a compound semiconductor substrate, a compound semiconductor diffusion limiting layer containing aluminum, disposed on the substrate, and having a larger aluminum content than the substrate, a compound semiconductor layer disposed on the diffusion limiting layer, a silicon film disposed on the semiconductor layer, and a diffusion region into which silicon has diffused from the silicon film to reach the interface between the diffusion limiting layer and the substrate. The diffusion limiting layer may be employed in a semiconductor laser to prevent silicon from diffusing beyond desired regions and to form a light-confining structure.

16 Claims, 3 Drawing Sheets

COMPOUND SEMICONDUCTOR STRUCTURE INCLUDING LAYER LIMITING SILICON DIFFUSION

This application is a division of application Ser. No. 07/264,142, filed Oct. 28, 1988, now U.S. Pat. No. 5,047,366.

FIELD OF THE INVENTION

The present invention relates to a method of diffusing silicon (Si) into compound semiconductor and compound semiconductor devices, and more particularly to controlling diffusion depth with a high degree of reproducibility and precision.

BACKGROUND OF THE INVENTION

FIG. 6 shows a cross-sectional view of a wafer for explaining a prior art method of diffusing Si. In FIG. 6, reference numeral 1 designates an $Al_xGa_{1-x}As$ layer ($0 \leq x < 1$) a III - V group compound semiconductor layer. A Si film 2 is disposed on a surface of the $Al_xGa_{1-x}As$ layer 1, for example, such vacuum evaporation, CVD (Chemical Vapor Deposition), or sputtering. A protection layer 3 comprising, for example, $SiO_2$ or $Si_3N_4$, disposed on layer 1 and film 2 for protecting the surfaces of the $Al_xGa_{1-x}As$ layer 1 and the Si film 2. Si may be diffused into layer 1 without providing this protection layer 3. Reference numeral 5 designates a region into which Si has been diffused.

The $Al_xGa_{1-x}As$ layer 1 having Si film 2 thereon is heated up to a temperature of about 800° to 950° C. in an ambient having arsenic (As) partial pressure of about 0.3 atmosphere. Then, Si diffuses into the $Al_xGa_{1-x}As$ layer 1 at the elevated temperature.

In this prior art diffusion method, diffusion time, diffusion temperature, arsenic pressure, Si film thickness, protection layer thickness, and the material of the protection layer can be selected as desired, as parameters which determine the diffusion speed and diffusion depth. For example, when the diffusion temperature is low, the arsenic pressure is low, the Si film is thick, and the protection layer is thick, the diffusion speed is low. The reason why the diffusion speed is low when the protection layer is thick is described in "1986 International Conference on Solid State Devices and Materials, pp 41 to 44". Since the annealing is conducted in an As ambient, As diffuses through the protection layer and reaches the interface between the protection layer and GaAs layer, thereby creating (that is, Ga vacancies in the GaAs layer. Si diffuses in association with these vacancies, so that the vacancies promote Si diffusion. When the protection layer is thick, As slowly reaches the interface, thereby lowering the diffusion speed.

Furthermore, it is reported in "Applied Physics Letters", Volume 44(8), Apr. 15, 1984, pp 750 to 752 and the "Journal of the Electrochemical Society", Volume 129, No. 4, 1982, pp 837 to 840 that the diffusion speed is lower when using a $Si_3N_4$ protection layer than when using a $SiO_2$ protection layer. When a $SiO_2$ protection layer is used, Ga in the GaAs layer is likely to diffuse into $SiO_2$ at the $SiO_2$ protection and GaAs layer interface during annealing. Thus, Ga vacancies will occur in the GaAs layer and Si will diffuse in association with these vacancies, thereby promoting the diffusion. On the other hand, when a $Si_3N_4$ protection layer is used, Ga is not likely to diffuse into $Si_3N_4$. In addition, since annealing is conducted in an As ambient, As will diffuse through the protection layer and reach the $SiO_2$ protection and GaAs layer interface, thereby creating an As rich region in GaAs layer. Since Si diffuses in association with the resulting Ga vacancies, diffusion is promoted. Since an $Si_3N_4$ film is denser than $SiO_2$, As more slowly reaches the interface, thereby reducing the diffusion speed.

When the Si diffusion process is employed in making a device, the diffusion depth needs to be precisely controlled. In the prior art diffusion method, however, since the diffusion depth depends on many parameters as described above, it is difficult to control the diffusion depth with a high degree of reproducibility and precision by suppressing variations of these parameters.

SUMMARY OF THE INVENTION

It is an object of the present invention to provide a method of diffusing Si into compound semiconductor controlling the Si diffusion depth with a high degree of reproducibility and precision.

Another object of the present invention is to provide a compound semiconductor device produced by utilizing the Si diffusion method.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, Si is diffused into a compound semiconductor with a diffusion limiting layer disposed at a predetermined depth from the surface of the compound semiconductor. The diffusion limiting layer provides a slower diffusion speed than that of the compound semiconductor. Then, even when the diffusion time is lengthened, less variation in the diffusion depth occurs. Accordingly, by slightly increasing the diffusion time, it is possible to control the diffusion depth with a high degree of reproducibility and precision regardless of variations that arise in the diffusion speed due to variations of in diffusion parameters.

DETAILED DESCRIPTION OF THE DRAWINGS

Figure 1:
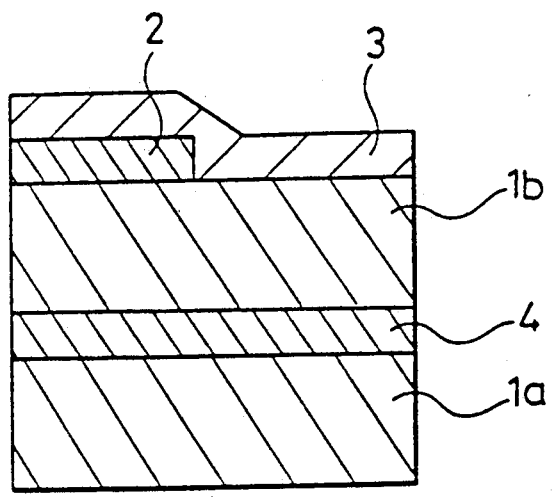
Figure 1:
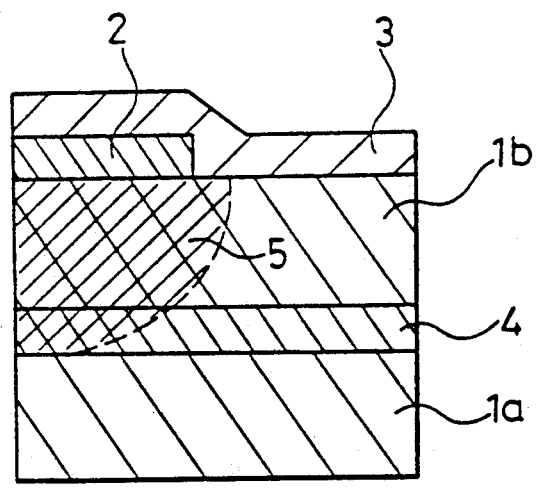
Figure 2:
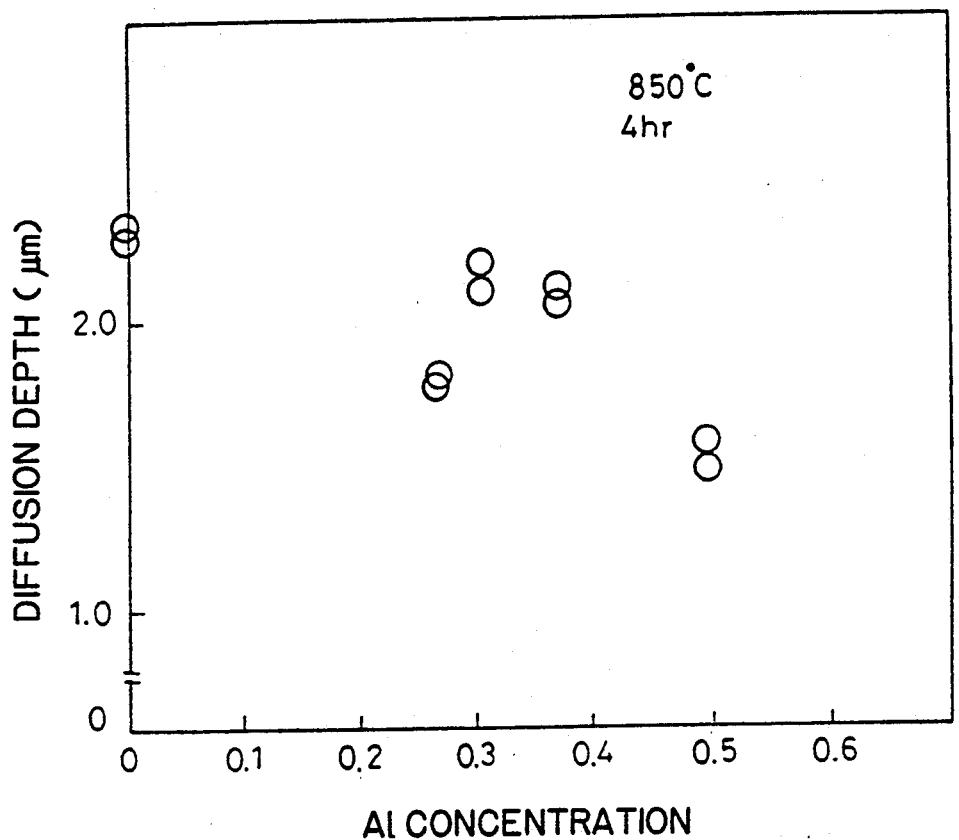
Figure 3:
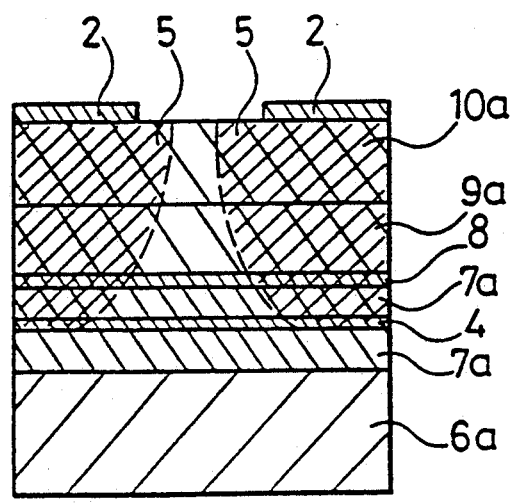
Figure 4:
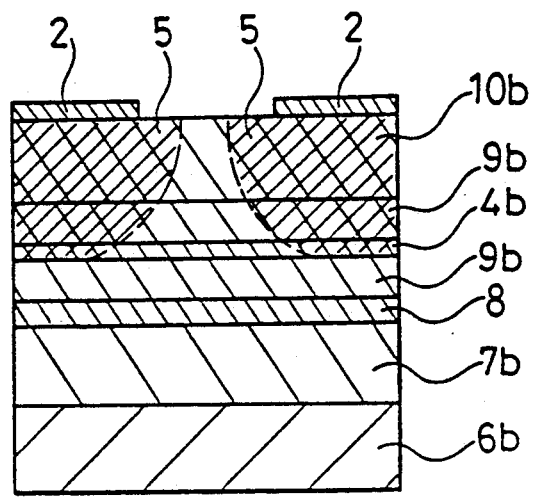
Figure 5:
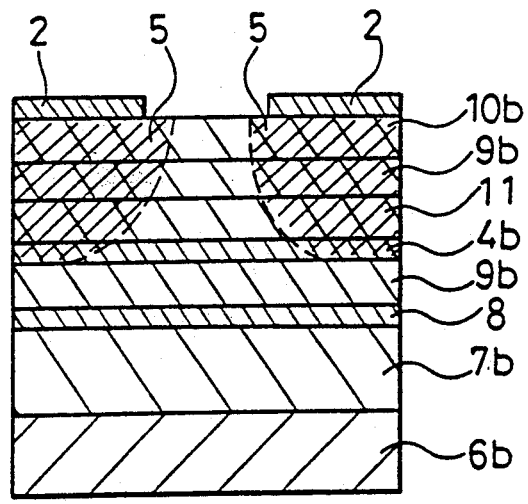
Figure 6:
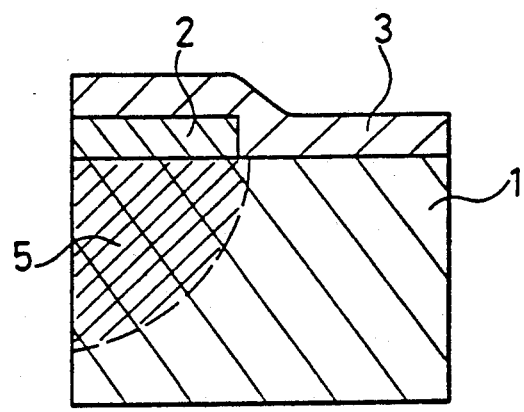

FIGS. 1(a) and 1(b) are diagrams showing cross-sectional views of a wafer for explaining a method of diffusing Si according to a first embodiment of the present invention;

FIG. 2 is a graph showing Al concentration versus diffusion depth characteristics according to the present invention;

FIGS. 3, 4, and 5 are diagrams showing cross-sectional views of laser diodes according to a second, a third, and a fourth embodiment of the present invention, respectively; and FIG. 6 is a diagram showing a cross-sectional view of a wafer for explaining a method of diffusing Si according to the prior art.

DETAILED DESCRIPTION OF THE PREFERRED EMBODIMENTS

An embodiment of the present invention will be described in detail with reference to the drawings.

FIGS. 1(a) and 1(b) show cross-sectional views for explaining a method of diffusing Si according to a first embodiment of the present invention. FIG. 1(a) shows a cross-sectional view of a wafer prior to Si diffusion and FIG. 1(b) shows the wafer in to which Si has been diffused.

In FIGS. 1(a) and 1(b), reference numerals 1a and 1b designate an $Al_xGa_{1-x}As$ substrate and an $Al_xGa_{1-x}As$ layer, respectively, III - V group compound semiconductor layers. A Si film 2 is disposed on the $Al_xGa_{1-x}As$ layer 1b. A protection layer 3 for protecting the surfaces of the $Al_xGa_{1-x}As$ layer 1b and the Si film 2 is disposed on the surface of layer 1b and Si film 2. A diffusion limiting layer 4 comprising $Al_yGa_{1-y}As$ (y>x) is disposed at a predetermined depth from the surface of the $Al_xGa_{1-x}As$ layer 1b between layers 1a and 1b. Si diffuses more slowly in diffusion limiting layer 4 than in the $Al_xGa_{1-x}As$ layer 1b. Reference numeral 5 designates a Si diffusion region.

The diffusion process will be described.

Si diffusion is generally carried out in a closed quartz ampoule in which arsenic partial pressure is supplied by a metal arsenide, or in an open quartz ampoule wherein arsenic partial pressure is supplied by injecting arsine ($AsH_3$). Here, the former process is employed. GaAs is employed as a sample, and the protection layer 3 is omitted. Si film 2 is deposited on the GaAs substrate to a thickness of 300 Å by vacuum evaporation.

The wafer and metal arsenide are set in the quartz ampoule, and the quartz ampoule is evacuated and closed. The weight of metal arsenide is about 40 mg for an ampoule volume of 40 cc. The quartz ampoule is put in the diffusion furnace and diffusion is carried out at a temperature of 850° C. in an arsenide ambient having an arsenic partial pressure of about 0.3 atmosphere.

As previously described, diffusion depth varies with Si film thickness, arsenic pressure, and temperature. When diffusion is carried out for four hours under the above described conditions, Si is diffused to a depth of 2.3 $\mu$m. On the other hand, when diffusion is carried out into a $Al_{0.5}Ga_{0.5}As$ substrate under the same condition, Si is diffused to a depth of only 1.5 $\mu$m. FIG. 2 is a graph showing Al concentration versus diffusion depth characteristics. As is apparent from FIG. 2, when the Al concentration is high, the diffusion depth is shallow, meaning lower diffusion speed.

If the diffusion depth is set to 2.3 $\mu$m, the diffusion limiting layer 4 is 0.3 $\mu$m thick, comprises $Al_yGa_{1-y}As$ (y≧0.3), and is provided a little above the diffusion front, (for example, at a position of 2.0 $\mu$m depth), diffusion can be easily stopped by the limiting layer 4. This means that even if a little variation should occur in the Si film thickness, arsenic partial pressure, and diffusion temperature, diffusion to a predetermined depth is realized only by conducting diffusion a little longer than usual, without unfavorable effects.

While in the above-illustrated embodiment the process of Si diffusion into GaAs layer is discussed, Si diffusion into an $Al_xGa_{1-x}As$ layer is carried out by the similar process. In this case, diffusion depth can be easily controlled with providing a diffusion limiting layer 4 comprising $Al_yGa_{1-y}As$ (y≧x+0.3).

FIG. 3 shows a cross-sectional view of a laser diode as a second embodiment of the present invention, wherein the Si diffusion method of the present invention is employed. In FIG. 3, reference numeral 6a designates a p type GaAs substrate. A p type $Al_{0.42}Ga_{0.58}As$ (or $Al_{0.33}Ga_{0.67}As$) lower cladding layer 7a is disposed on the substrate 6a. A diffusion limiting layer 4 about 0.1 $\mu$m thick, comprising p type $Al_{0.72}Ga_{0.28}As$ (or $Al_{0.63}Ga_{0.37}As$) is disposed at a position of 0.5 to 1 $\mu$m from an active layer 8 and between the upper and lower portions of the lower cladding layer 7a. A p type $Al_{0.08}Ga_{0.92}As$ (or GaAs) active layer 8 is disposed on the upper portion of the lower cladding layer 7a. An n type $Al_{0.42}Ga_{0.58}As$ (or $Al_{0.33}Ga_{0.67}As$) upper cladding layer 9a is disposed on the active layer 8. An n type GaAs contact layer 10a is disposed on the upper cladding layer 9a. Spaced apart Si films 2 are disposed on the contact layer 10a. Reference numeral 5 designates Si diffusion regions.

In this laser diode, the diffusion limiting layer 4 is provided at a position farther away from Si films 2 than the active layer 8. Since the Si films are spaced apart, two Si diffusion regions are formed in the active layer 8 having a lower refractive index than that of the central portion of the active layer 8 into which no Si is diffused. That division of the active layer 8 produces a light waveguide structure.

FIG. 4 shows a cross-sectional view of a laser diode as a third embodiment of the present invention, wherein the Si diffusion method of the present invention is employed. In FIG. 4, reference numeral 6b designates an n type GaAs substrate. An n type $Al_{0.42}Ga_{0.58}As$ (or $Al_{0.33}Ga_{0.67}As$) lower cladding layer 7b is disposed on the substrate 6b. A p type $Al_{0.08}Ga_{0.92}As$ (or GaAs) active layer 8 is disposed on the lower cladding layer 7b. A p type $Al_{0.42}Ga_{0.58}As$ (or $Al_{0.33}Ga_{0.67}As$) upper cladding layer 9b is disposed on the active layer 8. A diffusion limiting layer 4b about 0.1 $\mu$m thick, which comprises $Al_{0.72}Ga_{0.28}As$ (or $Al_{0.63}Ga_{0.37}As$) is disposed at a position of 0.2 to 0.3 $\mu$m distance from the active layer 8 and between the upper and lower portions of the upper cladding layer 9b. A p type GaAs contact layer 10b is disposed on the upper portion of the upper cladding layer 9b. Si films 3 are disposed, spaced apart, on contact layer 10b.

In this laser diode, the transverse mode of oscillation is controlled by the spatial distribution of Si that is produced by the Si diffusion. The pistons of the upper cladding layer 9b and the diffusion stopper layer 4b into which Si diffuses have a lower refractive index than the other portions of the cladding layer 9b and the stopper layer 4b. When the portions of high refractive index and low refractive index exist near the active layer, the active layer 8 has a refractive index variation in the transverse direction that confines the light in the center of the laser chip. Accordingly, the transverse mode oscillation structure can be controlled by controlling the diffusion depth, as well as the longitudinal direction mode oscillation. As discussed above, the distance between the diffusion front and the active layer strongly affects the laser diode characteristics, so that control of diffusion depth is of great importance, giving the present invention significant utility.

FIG. 5 shows a cross-sectional view of a laser diode having the structure of FIG. 4 and further including a lightguide layer 11. In this laser diode, the lightguide layer 11 comprising AlGaAs series superlattice is disposed between the diffusion limiting layer 4b and the upper cladding layer 9b. The superlattice is disordered in the Si diffusion region 5 to produce a uniform composition. The distinction between the layers of the superlattice are destroyed in the Si diffusion so that a relatively homogeneous crystalline composition is formed in the portions of cladding layer 9b that are included in Si diffusion regions 5. Since the mixed crystal portions have a refractive index which is different from that of the other portion of the superlattice, a light waveguide structure is produced. In this structure, the diffusion limiting layer 4 is disposed adjacent the light guide layer 11, and farther from Si films 2. The Si diffusion is precisely stopped by the limiting layer 4, thereby obtaining a laser diode with a high degree of reproducibility with uniform characteristics.

While AlGaAs series compound semiconductor is described above, the present invention may be applied to InGaAsP or AlGaInP series compound semiconductors having a diffusion limiting layer with a composition ratio different from that of the compound semiconductor and of lower diffusion speed than that of the compound semiconductor.

As discussed above, according to the present invention, Si diffusion into a compound semiconductor is carried out with a diffusion limiting layer disposed at a position of predetermined depth from the surface of the compound semiconductor, the diffusion limiting layer having a lower diffusion speed than that of the compound semiconductor. Thus, the diffusion depth can be controlled with a high degree of reproducibility and precision.

What is claimed is:

1. A compound semiconductor structure comprising:
   a compound semiconductor substrate;
   a compound semiconductor diffusion limiting layer containing aluminum disposed on said substrate and having a larger aluminum content than said substrate;
   a compound semiconductor layer disposed on said diffusion limiting layer;
   a silicon film disposed on said semiconductor layer as a diffusion source; and
   a diffusion region, containing silicon diffused from said film, disposed in said compound semiconductor layer and extending to the interface between said diffusion limiting layer and said substrate.

2. The compound semiconductor structure defined in claim 5 wherein said substrate comprises $Al_xGa_{1-x}As$, said diffusion limiting layer comprises $Al_xGa_{1-y}As$ such that $y \geq x+0.3$, and said compound semiconductor layer comprises $Al_xGa_{1-x}As$.

3. The compound semiconductor structure defined in claim 1, wherein said substrate and said compound semiconductor layer comprise $In_{1-x}Ga_xAs_yP_{1-y}$.

4. The compound semiconductor structure defined in claim 1, wherein said substrate and said compound semiconductor layer comprise $(Al_xGa_{1-x})_yIn_{1-y}P$.

5. A semiconductor laser comprising:
   a first conductivity type compound semiconductor substrate;
   a first conductivity type compound semiconductor lower cladding layer disposed on said semiconductor substrate, said lower cladding layer including upper and lower portions;
   a diffusion limiting layer comprising a first conductivity type compound semiconductor containing aluminum disposed between the upper and lower portions of said lower cladding layer and having a larger aluminum content than said lower cladding layer;
   a first conductivity type compound semiconductor active layer disposed on said upper portion of said lower cladding layer;
   a second conductivity type compound semiconductor upper cladding layer disposed on said active layer;
   a second conductivity type compound semiconductor contact layer disposed on said upper cladding layer;
   a silicon film disposed on part of said contact layer as a diffusion source; and
   a diffusion region, containing silicon diffused from said film, disposed in said contact, upper cladding, and active layers and extending to the interface between said diffusion limiting layer and said lower portion of said lower cladding layer.

6. The semiconductor laser defined in claim 5, wherein said semiconductor substrate comprises p type GaAs, said lower cladding layer comprises p type $Al_zGa_{1-z}As$, said diffusion limiting layer comprises p type $Al_yGa_{1-y}As$ where $x \geq z+0.3$ said active layer comprises p type $Al_wGa_{1-w}As$, said upper cladding layer comprises n type $Al_zGa_{1-z}As$, and said contact layer comprises n type GaAs.

7. The semiconductor laser defined in claim 5, wherein said lower cladding layer comprises $In_{1-x}Ga_xAs_yP_{1-y}$.

8. The semiconductor laser defined in claim 5, wherein said lower cladding layer comprises $(Al_xGa_{1-x})_yIn_{1-y}P$.

9. A semiconductor laser comprising:
   a second conductivity type compound semiconductor substrate;
   a second conductivity type compound semiconductor lower cladding layer disposed on said semiconductor substrate;
   a first conductivity type compound semiconductor active layer disposed on said lower cladding layer;
   a first conductivity type compound semiconductor upper cladding layer disposed on said active layer, said upper cladding layer including upper and lower portions;
   a diffusion limiting layer comprising a first conductivity type compound semiconductor containing aluminum disposed between the upper and lower portions of said upper cladding layer and having a larger aluminum content than said upper cladding layer;
   a first conductivity type compound semiconductor contact layer disposed on said upper cladding layer;
   a silicon film disposed on part of said contact layer opposite said upper cladding layer as a diffusion source; and
   a diffusion region, containing silicon diffused from said film, disposed in said contact and upper cladding layers and extending to the interface between said diffusion limiting layer and said lower portion of said upper cladding layer.

10. The semiconductor laser defined in claim 9, wherein said semiconductor substrate comprises n type GaAs, said lower cladding layer comprises n type $Al_zGa_{1-z}As$, said active layer comprises p type $Al_wGa_{1-w}As$, said upper cladding layer comprises p type $Al_zGa_{1-z}As$, said diffusion limiting layer comprises p type $Al_yGa_{1-y}As$ where $y \geq z+0.3$, and said contact layer comprises p type GaAs.

11. The semiconductor laser defined in claim 9, wherein said upper cladding layer comprises $In_{1-x}Ga_xAs_yP_{1-y}$.

12. The semiconductor laser compound defined in claim 9, wherein said upper cladding layer comprises $(Al_xGa_{1-x})_yIn_{1-y}P$.

13. The semiconductor laser defined in claim 9, comprising a light guide layer disposed between said diffusion limiting layer and said upper portion of said upper cladding layer.

14. The semiconductor laser defined in claim 13, wherein said semiconductor substrate comprises n type GaAs, said lower cladding layer comprises n type $Al_zGa_{1-z}As$, said active layer comprises p type $Al_wGa_{1-w}As$, said upper cladding layer comprises p type $Al_zGa_{1-z}As$, said diffusion stopper layer comprises p type $Al_yGa_{1-y}As$, where $y \geq z + 0.3$, said contact layer comprises p type GaAs, and said light guide layer comprises an AlGaAs series superlattice.

15. The semiconductor laser defined in claim 13, wherein said upper cladding layer comprises $In_{1-x}Ga_xAs_yP_{1-y}$.

16. The semiconductor laser defined in claim 13, wherein said upper cladding layer comprises $(Al_xGa_{1-x})_yIn_{1-y}P$.

* * * * *

UNITED STATES PATENT AND TRADEMARK OFFICE
CERTIFICATE OF CORRECTION

PATENT NO. : 5,119,150
DATED : June 2, 1992
INVENTOR(S) : Takashi Murakami

It is certified that error appears in the above-identified patent and that said Letters Patent is hereby corrected as shown below:

Column 5, line 41, change "$Al_xGa_{1-y}As$" to --$Al_{yx}Ga_{1-y}As$--.

Column 6, line 12, delete "semiconductor".

Column 6, line 66, delete "compound".

Signed and Sealed this

Twenty-first Day of September, 1993

BRUCE LEHMAN

*Attesting Officer*  *Commissioner of Patents and Trademarks*